US007663413B2

(12) United States Patent
Jang

(10) Patent No.: US 7,663,413 B2
(45) Date of Patent: Feb. 16, 2010

(54) LINE DRIVER CIRCUIT HAVING MEANS FOR STABILIZING OUTPUT SIGNAL

(75) Inventor: Seong-Jin Jang, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 96 days.

(21) Appl. No.: 11/483,422

(22) Filed: Jul. 7, 2006

(65) Prior Publication Data

US 2007/0035180 A1 Feb. 15, 2007

(30) Foreign Application Priority Data

Jul. 7, 2005 (KR) ........................ 10-2005-0061237
Jan. 9, 2006 (KR) ........................ 10-2006-0002381

(51) Int. Cl.
*H03B 1/00* (2006.01)
*H03K 3/00* (2006.01)
(52) U.S. Cl. ...................... 327/108; 327/112; 326/82; 326/83; 326/87
(58) Field of Classification Search ......... 327/108–112, 327/379–391, 142, 143, 198; 326/22–27, 326/82–87
See application file for complete search history.

(56) References Cited

U.S. PATENT DOCUMENTS

| 4,609,836 A | * | 9/1986 | Koike ......................... 326/86 |
| 5,023,472 A | * | 6/1991 | Hashimoto et al. .......... 327/108 |
| 5,198,699 A | | 3/1993 | Hashimoto et al. |
| 5,543,750 A | * | 8/1996 | Oh ............................... 327/589 |
| 5,751,142 A | * | 5/1998 | Dosho et al. ................. 323/316 |
| 6,166,563 A | * | 12/2000 | Volk et al. .................... 326/87 |
| 6,181,610 B1 | | 1/2001 | Shiga |

(Continued)

FOREIGN PATENT DOCUMENTS

KR 97-000290 1/1997

(Continued)

OTHER PUBLICATIONS

Simple RC Circuits http://people.seas.harvard.edu/~jones/es154/pages/nicetut/book2/RC.html.*

*Primary Examiner*—Lincoln Donovan
*Assistant Examiner*—Brandon S Cole
(74) *Attorney, Agent, or Firm*—F. Chau & Associates, LLC

(57) ABSTRACT

A line driver circuit for stabilizing a signal that is output through a transmission line, wherein the line driver circuit receives a first signal having a first swing width corresponding to a difference between a first voltage and a second voltage, creates a second signal having a second swing width less than the first swing width, and outputs the second signal through a transmission line. The line driver circuit includes: a pull-up circuit that pulls up the second signal to a high level; a pull-down circuit that is connected to the pull-up circuit and pulls down the second signal to a low level; and an initializing circuit that is connected to a node of the transmission line, outputs a signal having a voltage of the low level or the high level to the node of the transmission line, and initializes the voltage at the node of the transmission line to the low level or the high level.

19 Claims, 6 Drawing Sheets

U.S. PATENT DOCUMENTS

| | | | |
|---|---|---|---|
| 6,191,623 B1 * | 2/2001 | Gabara | 327/71 |
| 6,535,020 B1 * | 3/2003 | Yin | 326/83 |
| 6,744,294 B1 * | 6/2004 | Svensson et al. | 327/170 |
| 7,106,092 B2 * | 9/2006 | Kubo | 326/30 |
| 7,106,112 B2 * | 9/2006 | Jang | 327/143 |

FOREIGN PATENT DOCUMENTS

KR   2002-096092   12/2002

* cited by examiner

LINE DRIVER CIRCUIT HAVING MEANS FOR STABILIZING OUTPUT SIGNAL

CROSS-REFERENCE TO RELATED PATENT APPLICATIONS

This application claims the benefit of Korean Patent Application Nos. 10-2005-0061237, filed on Jul. 7, 2005 and 10-2006-0002381, filed on Jan. 9, 2006, in the Korean Intellectual Property Office, the disclosures of which are incorporated herein in their entirety by reference.

BACKGROUND OF THE INVENTION

1. Technical Field

The present disclosure relates to a line driver circuit and more particularly, to a line driver circuit having means for stabilizing a signal that is output through a transmission line.

2. Discussion of the Related Art

In general, in semiconductor devices having a plurality of circuits, signals are transmitted/received through transmission lines connecting the circuits, and power dissipation increases due to capacitances of the transmission lines. A line driver circuit for lowering power dissipation by reducing a swing width of a signal that is transmitted/received through a transmission line is disclosed in U.S. Pat. No. 5,023,472. The line driver circuit will now be described with reference to FIG. 1.

FIG. 1 is a circuit diagram of a conventional line driver circuit. In this line driver circuit, a swing width of a signal transmitted/received through a transmission line can be reduced using a charge sharing method.

The line driver circuit of FIG. 1 includes a pull-up circuit and a pull-down circuit that are connected in series between a first voltage VDD and a second voltage VSS. The pull-up circuit includes a first switch SW1 and a second switch SW2 that are connected in series to the first voltage VDD. Further, the pull-up circuit includes a first capacitor C1 connected to a common node of the first switch SW1 and the second switch SW2.

The pull-down circuit includes a third switch SW3 and a fourth switch SW4 that are connected in series to the second voltage VSS. A second capacitor C2 is connected to a common node of the third switch SW3 and the fourth switch SW4. A resistance component and a capacitance component of the transmission line are referred to as a resister RL and a capacitor CL, respectively.

When the first switch SW1 is turned off, and the second switch SW2 is turned on, charge sharing occurs between the first capacitor C1 and the capacitor CL of the transmission line, with the first capacitor C1 being pre-charged to the first voltage VDD and the capacitor CL being pre-charged to a low level. As a result, a signal OUT transmitted through the transmission line becomes a high level.

Thereafter, when the third switch SW3 is turned on, and the fourth switch SW4 is turned off, charge sharing occurs between the second capacitor C2 and the capacitor CL of the transmission line, with the second capacitor C2 being pre-charged to the second voltage VSS and the capacitor CL being pre-charged to the high level. As a result, the signal OUT transmitted through the transmission line becomes a low level.

This can be expressed by the following equation.

$$VH = VDD*C1*(C1+C2)/[CL*(C1+C2)+C1*C2]$$

$$VL = VDD*C1*CL/[CL*(C1+C2)+C1*C2] \quad \text{[Equation 1]}$$

(VH: high level voltage, VL: low level voltage)

Assume that $C1=C2=CL$ in the equation 1, then a swing width $VH-VL$ of the signal OUT is $\frac{1}{3}*VDD$.

In other words, when the signal OUT is toggled, the required charge quantity can be reduced by ⅓, thereby lowering power dissipation by ⅓.

When the line drive circuit is powered up, or when the circuit has not operated for a long time, a node of the transmission line is required to be initialized so as to make the signal OUT become the high level or the low level. Otherwise, an abnormal voltage may be generated while the line drive circuit operates normally, thereby causing errors.

Also, when charge sharing occurs between the capacitor CL of the transmission line and the capacitors C1 and C2 of the pull-up circuit and the pull-down circuit, a leakage current may be generated. Thus, the signal OUT may not reach to the high level or the low level. While the leakage current increases, the signal OUT may be shifted to the opposite level.

The conventional line driver circuit does not have a voltage initializing means or a means for compensating for changes in signal level caused by the leakage current, which may make the signal OUT unstable.

SUMMARY OF THE INVENTION

Embodiments of the present invention provide a line driver circuit having a means for stabilizing an output signal, such as an initializing circuit and a voltage compensator, so as to stabilize a signal that is transmitted through a transmission line.

According to an embodiment of the present invention, there is provided a line driver circuit that receives a first signal having a first swing width corresponding to a difference between a first voltage and a second voltage, creates a second signal having a second swing width less than the first swing width, and outputs the second signal through a transmission line, the line driver circuit comprising: a pull-up circuit that pulls up the second signal to a high level; a pull-down circuit that is connected to the pull-up circuit and pulls down the second signal to a low level; and an initializing circuit that is connected to a node of the transmission line, outputs a signal having a voltage of the low level or the high level to the node of the transmission line, and initializes the voltage at the node of the transmission line to the low level or the high level.

In the aforementioned line driver circuit, the transmission line may be connected to a common node of the pull-up circuit and the pull-down circuit.

In addition, the second signal may have a voltage of which the high level is less than the first voltage and the low level is greater than the second voltage.

In addition, the initializing circuit may comprise: a first switch of which one end is connected to a third voltage and which is controlled by a control signal; a second switch of which one end is connected to a fourth voltage and that is controlled by the control signal; and a voltage divider that is connected between the first switch and the second switch, and when the first switch and the second switch are turned on, the third voltage and the fourth voltage are divided to create a voltage of the high level and a voltage of the low level.

In addition, in the initializing circuit, the third voltage may be equal to the first voltage, and the fourth voltage may be equal to the second voltage.

In addition, the initializing circuit may further comprise: a third switch that controls an output of the voltage of the high level created by the voltage divider; and a fourth switch that controls an output of the voltage of the low level.

In addition, in the initializing circuit, the third switch and the fourth switch may be controlled by the control signal.

In addition, in the initializing circuit, the first to fourth switches may be controlled to be turned on or turned off at the same time.

According to an embodiment of the present invention, there is provided a line driver circuit that receives a first signal having a first swing width corresponding to a difference between a first voltage and a second voltage, creates a second signal having a second swing width less than the first swing width, and outputs the second signal through a transmission line, the line driver circuit comprising: a pull-up circuit that pulls up the second signal to a high level; a pull-down circuit that is connected to the pull-up circuit and that pulls down the second signal to a low level; and a first voltage compensator that is connected to the pull-up circuit to prevent changes in the voltage level of the second signal, when the second signal having the high level is output through the transmission line.

The aforementioned lined driver circuit may further comprise a second voltage compensator that is connected to the pull-down circuit to prevent changes in the voltage level of the second signal, when the second signal of the low level is output through the transmission line.

BRIEF DESCRIPTION OF THE DRAWINGS

Exemplary embodiments of the present invention can be understood in more detail from the following descriptions taken in conjunction with the attached drawings in which.

DESCRIPTION OF THE EXEMPLARY EMBODIMENTS

Figure 1:
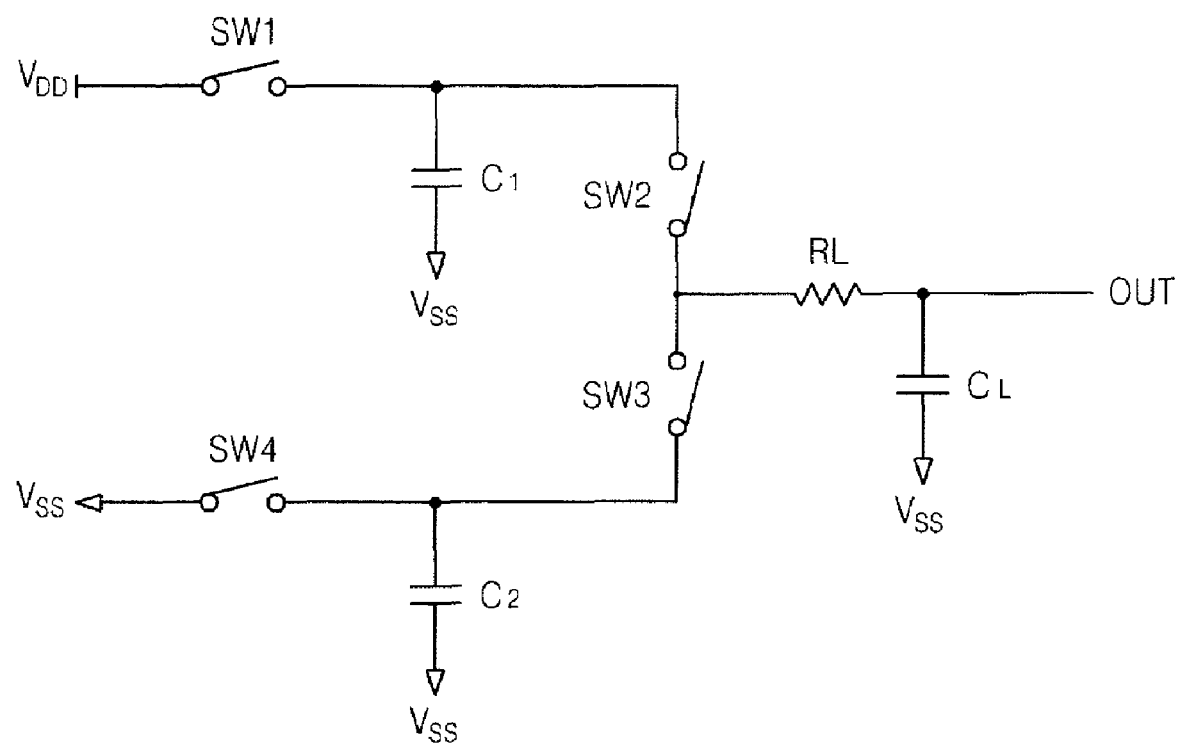
FIG. 1 is a circuit diagram of a conventional line driver circuit.

Exemplary embodiments of the present invention are described more fully hereinafter with reference to the attached drawings. Like reference numerals denote like elements in the drawings.

Figure 2:
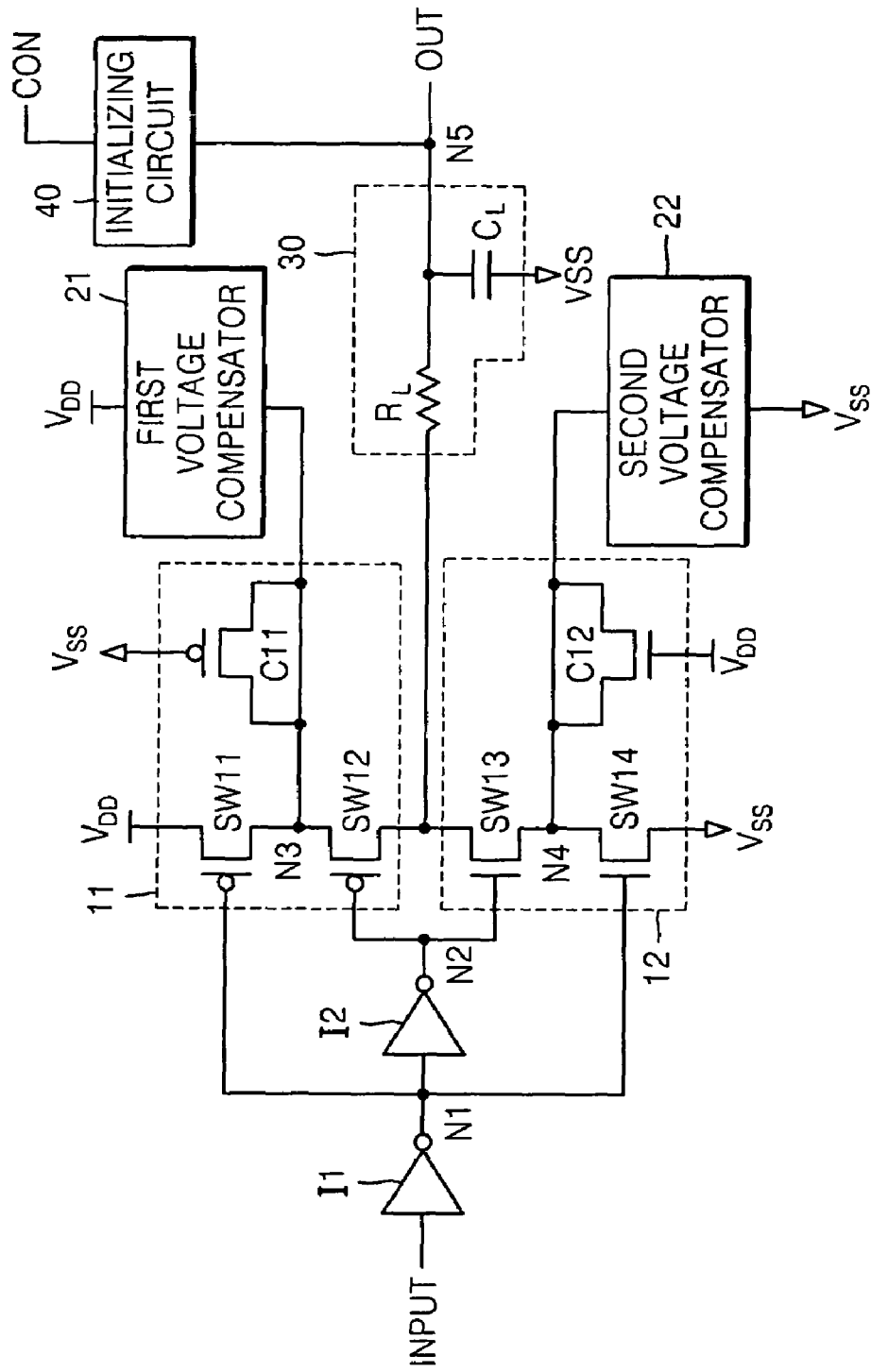
FIG. 2 is a circuit diagram of a line driver circuit according to an embodiment of the present invention.

FIG. 2 is a circuit diagram of a line driver circuit according to an embodiment of the present invention.

A first signal INPUT is input to the line driver circuit to generate a second signal OUT. The first signal INPUT has a first swing width corresponding to a difference between a first voltage VDD and a second voltage VSS. The second signal OUT has a second swing width less than the first swing width, and the second swing width corresponds to a difference between a high level VH and a low level VL. The second signal OUT is output through a transmission line 30. The first voltage VDD is a power source voltage. The second voltage VSS may be a ground voltage.

Referring to FIG. 2, the line driver circuit includes a pull-up circuit 11, a pull-down circuit 12, and an initializing circuit 40. The transmission line 30 is connected to a common node of the pull-up circuit 11 and the pull-down circuit 12. A resistor RL and a capacitor CL are a resistance component and a capacitance component of the transmission line 30, respectively.

The pull-up circuit 11 pulls up the second signal OUT to the high level VH. The pull-down circuit 12 is connected to the pull-up circuit 11 in series, and pulls down the second signal OUT to the low level VL.

The pull-up circuit 11 may include one or more switches and capacitors. Specifically, the pull-up circuit 11 may include a first switch SW11 and a second switch SW12 which are connected in series, and a first capacitor C11 connected to a common node N3 of the first switch SW11 and the second switch SW12.

The first switch SW11 and the second switch SW12 may be PMOS transistors. A first electrode of the first switch SW11 is connected to the first voltage VDD. A first electrode of the second switch SW12 is connected to a second electrode of the first switch SW11, and a second electrode of the second switch SW12 is connected to the pull-down circuit 12.

Also, the pull-down circuit 12 may include one or more switches and capacitors. Specifically, the pull-down circuit 12 may include a third switch SW13 of which a first electrode is connected to the pull-up circuit 11 and a fourth switch SW14 of which a first electrode is connected to a second electrode of the third switch SW13 and of which a second electrode is connected to the second voltage VSS. In addition, pull-down circuit 12 may further include a second capacitor C12 connected to a common node N4 of the third switch SW13 and the fourth switch SW14. The third switch SW13 and the fourth switch SW14 may be NMOS transistors.

The initializing circuit 40 is connected to a node N5 of the transmission line 30. When the line driver circuit is powered up, or the circuit has not operated for a long time, a signal corresponding to a voltage of the high level VH or the low level VL is output to the node N5 of the transmission line 30. In this manner, the node N5 connected to the initializing circuit 40 is initialized to the high level VH or the low level VL.

Figure 3:
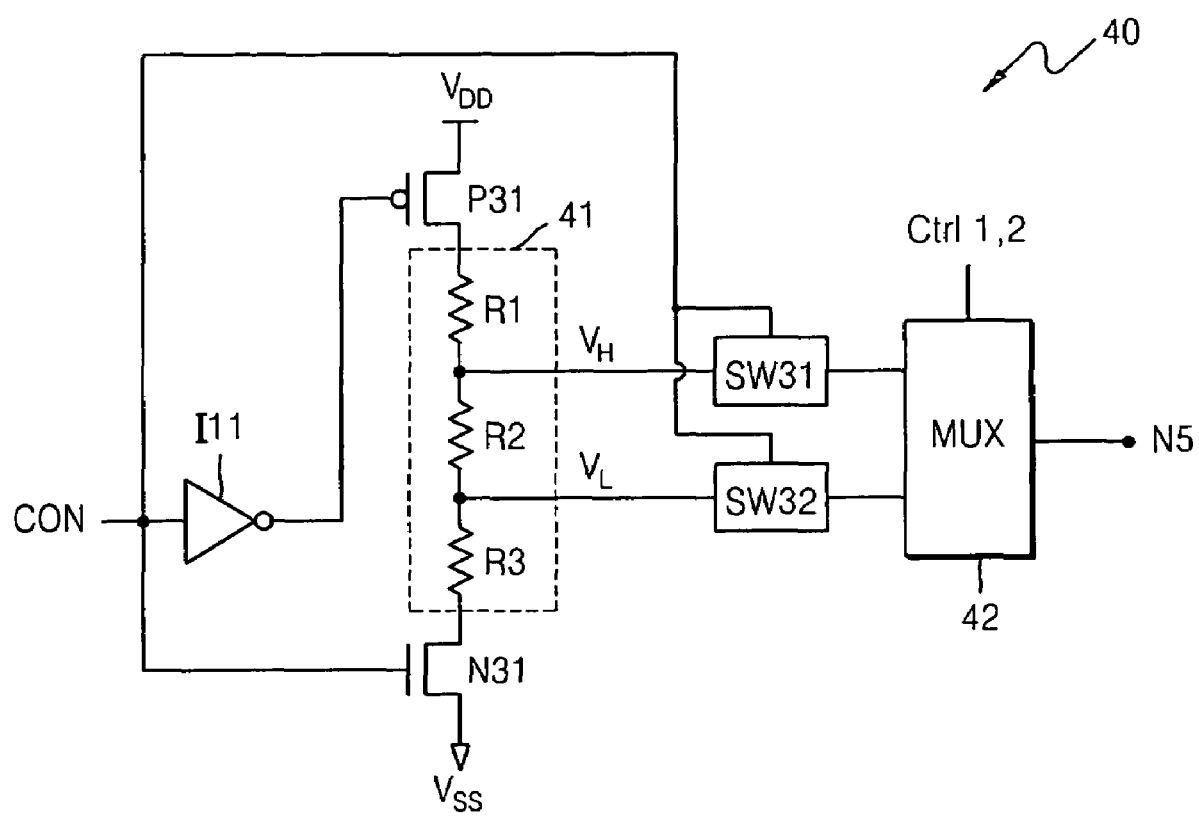
FIG. 3 is a circuit diagram of the initializing circuit of FIG. 2 according to an embodiment of the present invention.

FIG. 3 is a circuit diagram of the initializing circuit 40 of FIG. 2 according to an embodiment of the present invention. Referring to FIG. 3, the initializing circuit 40 includes a voltage divider 41 located between two voltage sources. Preferably, the two voltage sources are the first voltage VDD and the second voltage VSS. The initializing circuit 40 further include a first switch P31 which controls connection between the first voltage VDD and the voltage divider 41, and a second switch N31 which controls connection between the second voltage VSS and the voltage divider 41.

The voltage divider 41 includes one or more resistors R1, R2, and R3. The first switch P31 may be a PMOS transistor, and the second switch N31 may be an NMOS transistor. Also, the initializing circuit 40 may include an inverter 11 by which different levels of control signals are applied to the first switch P31 and the second switch N31.

The voltage divider may further include a third switch SW31, which controls an output of a voltage of the high level VH generated by the voltage divider 41, and a fourth switch SW32 which controls an output of a voltage of the low level VL.

The first to fourth switches P31, N31, SW31, and SW32 are controlled by a control signal CON, and so may be turned on or turned off at the same time. The control signal CON is activated when the line driver circuit is powered up, or the circuit has not operated for a long time, to turn on the first to fourth switches P31, N31, SW31, and SW32.

The initializing circuit 40 may further include a multiplexer 42 to initialize the node N5 of the transmission line 30 to the high level VH or the low level VL. The multiplexer 42 selectively outputs one of input voltages of high level VH and the low level VL. The output node of the multiplexer 42 is connected to the node N5 of the transmission line 30.

The operation of the line driver circuit will now be described with reference to FIGS. 2 to 4.

Figure 4:
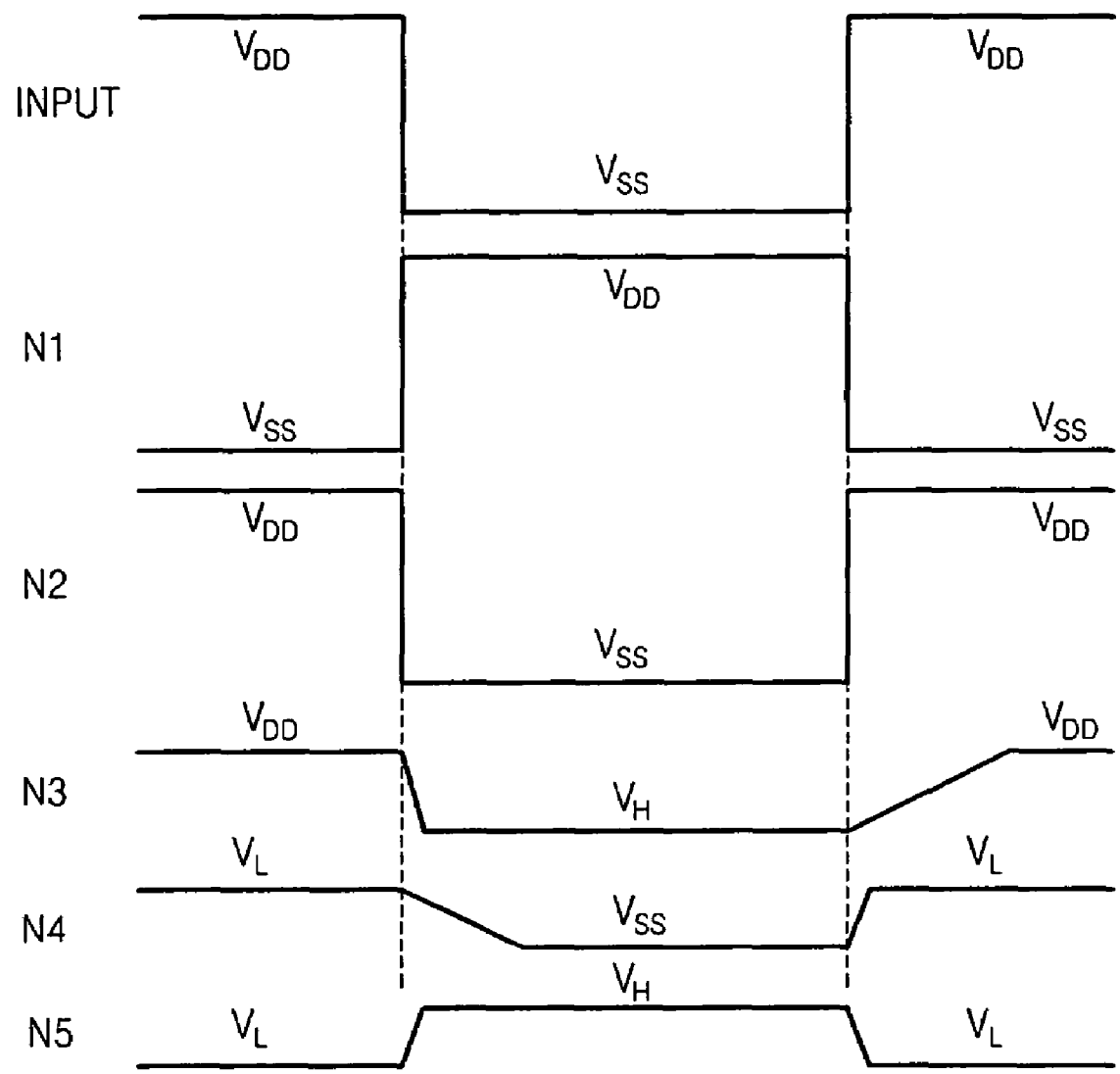
FIG. 4 illustrates waveforms during the operation of the line driver circuit of FIG. 2.

FIG. 4 illustrates an example of waveforms during the operation of the line driver circuit of FIG. 2. When the first signal INPUT applied to the line driver circuit is equal to the first voltage VDD, the first switch SW11 of the pull-up circuit 11 is turned on, and the second switch SW12 of the pull-up circuit 11 is turned off. In this case, the first voltage VDD connected to one electrode of the first switch SW11 is connected to the first capacitor C11, and thus the first capacitor C11 is pre-charged to the first voltage VDD. In the capacitor CL of the transmission line 30, a voltage of the low level VL is pre-charged by the operation of the initializing circuit 40 or by charge sharing with the pull-down circuit 12.

Thereafter, the first signal INPUT is shifted from the first voltage VDD to the second voltage VSS. In this case, the voltage at a node N1 is equal to the first voltage VDD, and thus the first switch SW11 of the pull-up circuit 11 is turned off, and the second switch SW12 of the pull-up circuit 11 is turned on. As a result, charge sharing occurs between the first capacitor C11 and the capacitor CL of the transmission line 30, with the first capacitor C11 being pre-charged to the first voltage VDD, and the capacitor CL being pre-charged to the low level VL. Due to the charge sharing, voltages at a node 3 N3 and a node 5 N5 become the high level VH in the range between the first voltage VDD and the low level VL. Also, the second signal OUT that is output through the transmission line 30 becomes the high level VH.

Meanwhile, the third switch SW13 of the pull-down circuit 12 is turned off, and the fourth switch SW14 of the pull-down circuit 12 is turned on, thereby connecting the second capacitor C12 to the second voltage VSS. As a result, the second capacitor C12 is pre-charged to the second voltage VSS.

Thereafter, the first signal INPUT is shifted from the second voltage VSS to the first voltage VDD. In this case, the voltage at the node N1 becomes the same to the second voltage VSS, and thus the third switch SW13 of the pull-down circuit 12 is turned on, and the fourth switch SW14 of the pull-down circuit 12 is turned off.

In this case, similarly to the operation above, charge sharing occurs between the second capacitor C12 and the capacitor CL of the transmission line 30, with the second capacitor C12 being pre-charged to the second voltage VSS and the capacitor CL being precharged to a voltage of high level VH. As a result, the voltages at the node N4 and the node N5 become the low level VL, and the second signal OUT also has a voltage of the low level VL.

Through the aforementioned operation, the first signal INPUT has a swing width corresponding to a difference between the first voltage VDD and the second voltage VSS, whereas the signal OUT has a swing width corresponding to a difference between the high level VH and the low level VL. The swing width of the signal OUT is less than a voltage difference between the first voltage VDD and the second voltage VSS, that is, the swing width of the first signal INPUT. Thus, charge quantity required to toggle signals can be reduced, thereby lowering total power dissipation.

As described above, when the line driver circuit is powered up before the line driver circuit normally operates, the initializing circuit 40 operates. Also, when the circuit has not operated for a long time, the initializing circuit 40 may operate. The operation of the initializing circuit 40 will now be described in detail with reference to FIG. 5.

Figure 5:
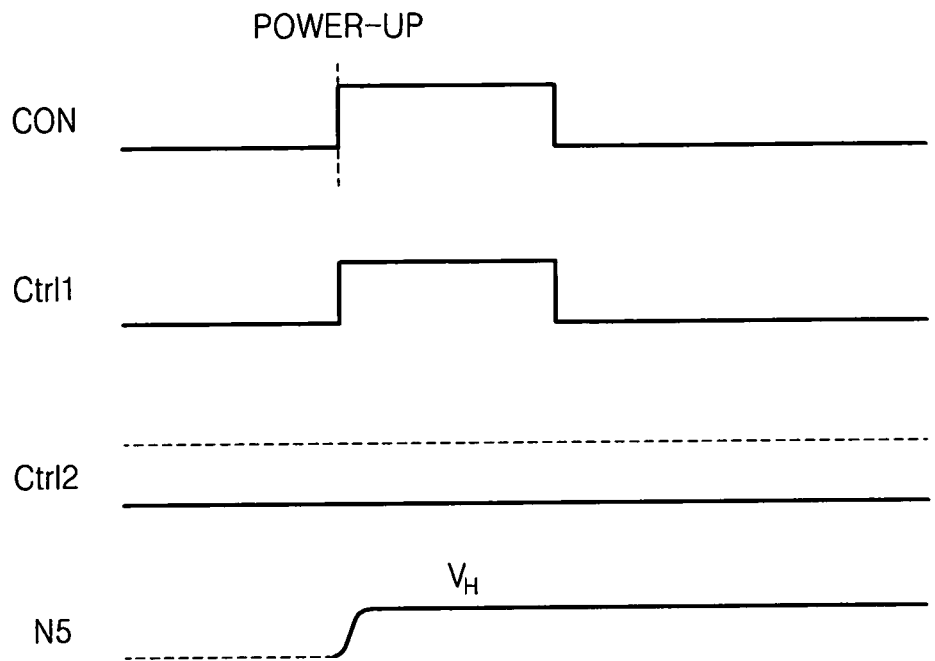
FIG. 5 illustrates waveforms during the operation of the initializing circuit of FIG. 3.

FIG. 5 illustrates an example of waveforms during the operation of the initializing circuit 40 of FIG. 3. Referring to FIG. 5, the control signal CON applied to the initializing circuit 40 is activated for a predetermined period when the line driver circuit is powered up, and thus the first to fourth switches P31, N31, SW31, and SW32 are turned on. The control signal CON may be shifted to a level corresponding to the first voltage VDD.

In this case, the first switch P31 and second switch N31 of the initializing circuit 40 are turned on. As a result, a voltage between the first voltage VDD connected to the first switch P31 and the second voltage VSS connected to the second switch N31 is divided by the voltage divider 41. A voltage divided into the high level VH is output through a common node of the first resistor R1 and the second resistor R2. Also, a voltage divided into the low level VL is output through a common node of the second resistor R2 and the third resistor R3.

The voltage divided into the high level VH and the voltage divided into the low level VL are input to the third switch SW31 and the fourth switch SW32, respectively. Since the third switch SW31 and the fourth switch SW32 are turned on in response to the control signal CON, the voltage divided into the high level VH and the voltage divided into the low level VL are input to the multiplexer 42.

The multiplexer 42 is controlled by first and second control signals CTRL1 and CTRL2. When the first control signal CTRL1 is activated, the voltage divided into the high level VH is output. When the second control signal CTRL2 is activated, the voltage divided into the low level VL is output. To initialize the node N5 of the transmission line 30 to the high level VH, the first control signal CTRL1 is activated as shown in FIG. 5, and thus the voltage divided in the high level VH is applied to the node N5.

Although not shown, to initialize the node N5 of the transmission line 30 to the low level VL, the second control signal CTRL2 is activated while the control signal CON is activated. Accordingly, the node N5 of the transmission line 30 can be initialized to the low level VL or the high level VH when the line driver circuit is powered up.

Thereafter, the control signal CON is de-activated when the line driver circuit normally operates. The third switch SW31 and the fourth switch SW32 are turned off in response to the control signal CON, thereby separating the initializing circuit 40 from the line driver circuit.

The line driver circuit using the charge sharing method may have an unstable output signal due to a leakage current. A voltage compensator for solving the problem will now be described with reference to FIGS. 6A, 6B and 7A, 7B.

Figure 6A:
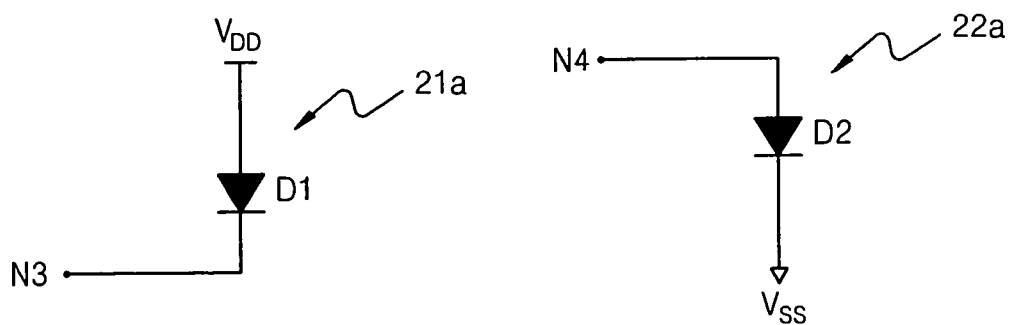
FIGS. 6A and B are circuit diagrams illustrating examples of the voltage compensators of FIG. 2.

FIGS. 6A and B are circuit diagrams illustrating examples of voltage compensators. FIG. 6A illustrates an example of the voltage compensators of FIG. 2. Referring to FIG. 6A, a first voltage compensator 21a includes a diode D1. One electrode of the diode D1 is connected to the first capacitor C11 and the common node of the first switch SW11 and the second switch SW12, and the other electrode of the diode D1 may be connected to the first voltage VDD.

A second voltage compensator 22a includes a diode D2. One electrode of the diode D2 is connected to the second capacitor C12 and the common node N4 of the third switch SW13 and the fourth switch SW14, and the other electrode of the diode D2 may be connected to the second voltage VSS.

Figure 6B:
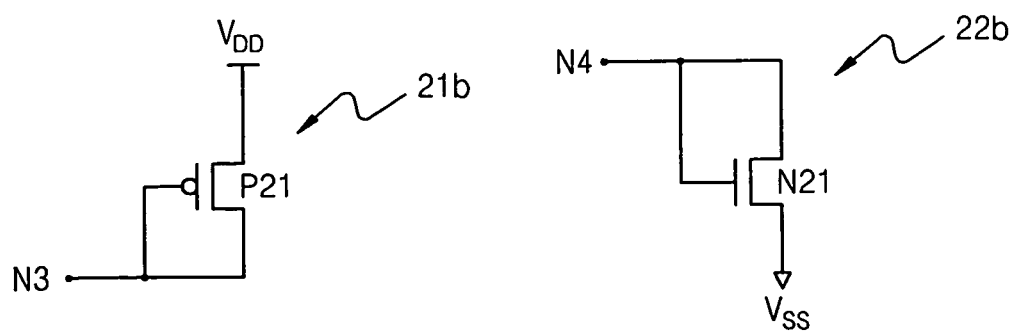

FIG. 6B illustrates another example of the voltage compensators of FIG. 2. A first voltage compensator 21b includes a transistor P21. In FIG. 6B, the transistor P21 is a PMOS transistor. The transistor P21 is diode-connected. One end of the transistor P21 is connected to the first capacitor C11 and the common node N3 between the first switch SW11 and the second switch SW12, and the other end of the transistor P21 may be connected to the first voltage VDD.

Likewise, a second voltage compensator 22b includes a transistor N21. In FIG. 6B, the transistor P21 is a NMOS transistor. The transistor N21 is diode-connected. One end of the transistor N21 is connected to the second capacitor C12 and the common node N4 between the third switch SW13 and the fourth switch SW14, and the other end of the transistor N21 may be connected to the second voltage VSS.

The operation of the line driver circuit according to the aforementioned voltage compensators will now be described, in which it is assumed that the voltage compensators are the transistors shown in FIG. 6B.

Figure 7A:
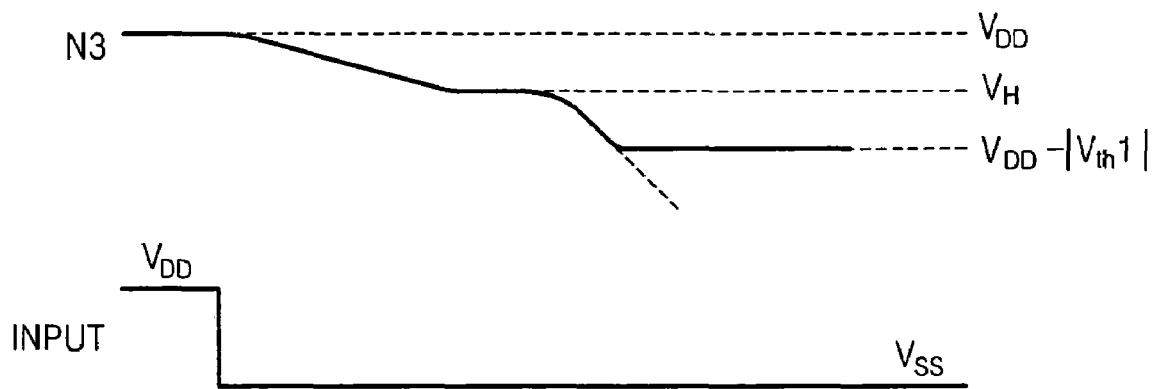
FIGS. 7A and B illustrate waveforms of an output signal of a line driver circuit having a voltage compensator.

FIGS. 7A and B illustrate waveforms of an output signal of a line driver circuit having a voltage compensator.

Referring to FIG. 7A, when the first signal INPUT is shifted to the second voltage VSS, charge sharing occurs between the first capacitor C11 and the capacitor CL of the transmission line 30. Since the first voltage VDD is pre-charged in the first capacitor C11, and the low level VL is pre-charged in the capacitor CL of the transmission line 30, the voltage at the node N3 changes from the first voltage VDD to the high level VH. Thus, the second signal OUT of the high level VH is output.

In this case, if a leakage current is generated, the voltage at the node N3 decreases, thereby dropping a voltage corresponding to the second signal OUT. When the voltage at the node N3 decreases to a value corresponding to VDD−|Vth1|, where |Vth1| is a threshold voltage of the transistor P21, the transistor P21 of the first compensator is turned on. The transistor P21 of the first compensator is diode-connected, and thus the voltage at the node N3 and the voltage corresponding to the second signal OUT are held equal to the voltage VDD−|Vth1|.

Figure 7B:
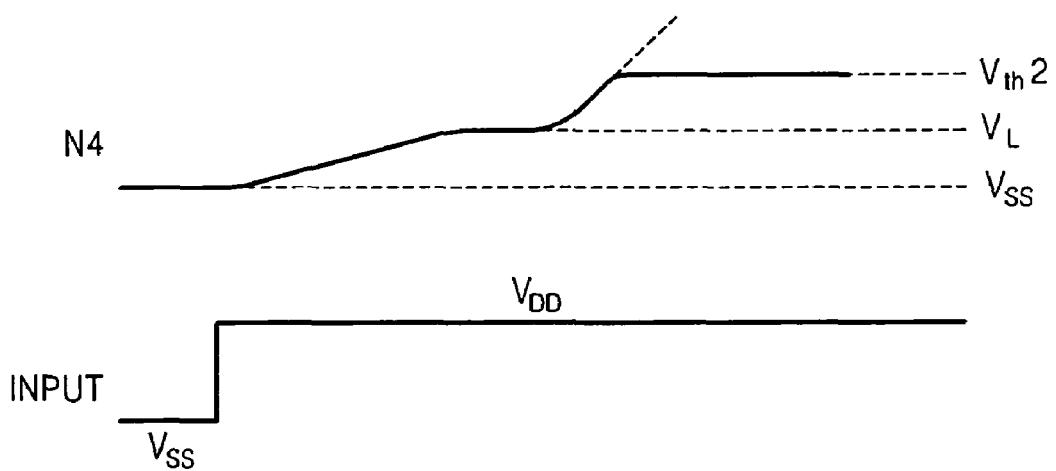

Referring to FIG. 7B, when the first signal INPUT is shifted to the first voltage VDD, charge sharing occurs between the second capacitor C12 and the capacitor CL of the transmission line 30. Since the second voltage VSS is pre-charged in the second capacitor C12, and the high level VH is pre-charged in the capacitor CL of the transmission line 30, the voltage at the node N4 changes from the second voltage VSS to the low level VL. Thus, the second signal OUT of the low level VL is output.

In this case, if the voltage at the node N4 increases due to a leakage current, the voltage corresponding to the second signal OUT increases gradually. As the voltage at the node N4 increases to Vth2, where the voltage Vth2 is a threshold voltage of the transistor N21, the transistor N21 of the second compensator is turned on. The transistor N21 of the second compensator is diode-connected, and thus the voltage at the node N4 and the voltage corresponding to the second signal OUT are held at Vth2. Namely, since the second signal OUT is held at a constant level by the voltage compensator, the second signal OUT may be stable even in the presence of a leakage current, and the second signal OUT will not be shifted to the opposite level.

Accordingly, a line driver circuit of an embodiment of the present invention has a means for stabilizing an output signal, such as an initializing circuit and a voltage compensator, to stabilize a signal that is transmitted through a transmission line, thereby preventing errors when an abnormal voltage is generated during a normal operation of the line driver circuit.

While the present invention has been particularly shown and described with reference to exemplary embodiments thereof, it will be understood by those skilled in the art that various changes in form and details may be made therein without departing from the spirit and scope of the present invention as defined by the appended claims.

What is claimed is:

1. A line driver circuit receives a first signal having a first swing width corresponding to a difference between a first voltage and a second voltage, creates a second signal having a second swing width less than the first swing width, and outputs the second signal through a transmission line, the line driver circuit comprising:
   a pull-up circuit that pulls up the second signal to a high level;
   a pull-down circuit that is connected to the pull-up circuit and pulls down the second signal to a low level; and
   an initializing circuit that is connected to a node of the transmission line, outputs a signal having a voltage of the low level or the high level to the node of the transmission line, and initializes the voltage at the node of the transmission line to the low level or the high level,
   wherein the initializing circuit initializes the transmission line in response to a control signal that is activated during at least an initialization period and generates the signal having a voltage of the low level or the high level based on a voltage dividing operation, and
   wherein the initializing circuit comprises:
   a first switch of which one end is connected to a third voltage and that is controlled by a control signal;
   a second switch of which one end is connected to a fourth voltage and that is controlled by the control signal; and
   a voltage divider that is connected between the first switch and the second switch, and when the first switch and the second switch are turned on, the third voltage and the fourth voltage are divided to create a voltage of the high level and a voltage of the low level.

2. The line driver circuit of claim 1, wherein the transmission line is connected to a common node of the pull-up circuit and the pull-down circuit.

3. The line driver circuit of claim 2, wherein the second signal has a voltage of which the high level is less than the first voltage and the low level is greater than the second voltage.

4. The line driver circuit of claim 1, wherein in the initializing circuit, the third voltage is equal to the first voltage, and the fourth voltage is equal to the second voltage.

5. The line driver circuit of claim 4, wherein the initializing circuit further comprises:
   a third switch that controls an output of the voltage of the high level created by the voltage divider; and
   a fourth switch that controls an output of the voltage of the low level.

6. The line driver circuit of claim 5, wherein the initializing circuit further comprises a multiplexer that outputs the voltage of the high level or the voltage of the low level to the node of the transmission line.

7. The line driver circuit of claim 6, wherein in the initializing circuit, the third switch and the fourth switch are controlled by the control signal.

8. The line driver circuit of claim 7, wherein in the initializing circuit, the first to fourth switches are controlled to be turned on or turned off at the same time.

9. The line driver circuit of claim 1, wherein the pull-up circuit comprises:
   a first switch of which a first electrode is connected to the first voltage;
   a second switch of which a first electrode is connected to a second electrode of the first switch, and a second electrode is connected to the pull-down circuit; and
   a first capacitor that is connected to a common node of the first switch and the second switch.

10. The line driver circuit of claim 9, wherein the pull-down circuit comprises:
- a third switch of which a first electrode is connected to the pull-up circuit;
- a fourth switch of which a first electrode is connected to a second electrode of the third switch, and a second electrode is connected to the second voltage; and
- a second capacitor that is connected to a common node of the third switch and the fourth switch.

11. The line driver circuit of claim 10, further comprising a first voltage compensator connected to the first capacitor of the pull-up circuit to prevent changes in a voltage level of the second signal, when the second signal of the high level is output through the transmission line,
- wherein the first voltage compensator is activated when a voltage of a node within the pull-up circuit becomes lower than a voltage level corresponding to a high level of the second signal by a predetermined value and controls the voltage of the node to be a constant level.

12. The line driver circuit of claim 11, wherein the first voltage compensator is connected between the first voltage and the first capacitor, and includes a diode-connected transistor.

13. The line driver circuit of claim 10, wherein the pull-down circuit further comprises a second voltage compensator connected to the second capacitor of the pull-down circuit to prevent changes in the voltage level of the second signal, when the second signal becomes higher than a voltage level corresponding to the low level of the second signal by a predetermined value.

14. The line driver circuit of claim 13, wherein the second voltage compensator is connected between the second voltage and the second capacitor, and includes a diode-connected transistor.

15. A line driver circuit that receives a first signal having a first swing width corresponding to a difference between a first voltage and a second voltage, creates a second signal having a second swing width less than the first swing width, and outputs the second signal through a transmission line, the line driver circuit comprising:
- a pull-up circuit that pulls up the second signal to a high level;
- a pull-down circuit that is connected to the pull-up circuit and that pulls down the second signal to a low level;
- a first voltage compensator that is connected to the pull-up circuit to prevent changes in a voltage level of the second signal, when the second signal of the high level is output through the transmission line,
- wherein the first voltage compensator is activated when a voltage of a node within the pull-up circuit becomes lower than a voltage level corresponding to a high level of the second signal by a predetermined value and controls the voltage of the node to be a constant level; and
- a second voltage compensator that is connected to the pull-down circuit to prevent changes in the voltage level of the second signal, when the second signal becomes higher than a voltage level corresponding to the low level of the second signal by a predetermined value.

16. The line driver circuit of claim 15, wherein the pull-up circuit comprises:
- a first switch of which a first electrode is connected to the first voltage;
- a second switch of which a first electrode is connected to a second electrode of the first switch, and a second electrode is connected to the pull-down circuit; and
- a first capacitor that is connected to a common node of the first switch and the second switch.

17. The line driver circuit of claim 16, wherein the pull-down circuit comprises:
- a third switch of which a first electrode is connected to the pull-up circuit;
- a fourth switch of which a first electrode is connected to a second electrode of the third switch, and a second electrode is connected to the second voltage; and
- a second capacitor that is connected to a common node of the third switch and the fourth switch.

18. The line driver circuit of claim 17, wherein the first voltage compensator is connected between the first voltage and the first capacitor, and includes a diode-connected transistor.

19. The line driver circuit of claim 18, wherein the second voltage compensator is connected between the second voltage and the second capacitor, and includes a diode-connected transistor.

* * * * *